US007324396B2

(12) United States Patent
Thwaite

(10) Patent No.: US 7,324,396 B2
(45) Date of Patent: Jan. 29, 2008

(54) SENSE AMPLIFIER ORGANIZATION FOR TWIN CELL MEMORY DEVICES

(75) Inventor: Peter Thwaite, Burlington, VT (US)

(73) Assignee: Infineon Technologies AG, Neubiberg (DE)

( * ) Notice: Subject to any disclaimer, the term of this patent is extended or adjusted under 35 U.S.C. 154(b) by 68 days.

(21) Appl. No.: 11/253,727

(22) Filed: Oct. 20, 2005

(65) Prior Publication Data

US 2007/0091699 A1 Apr. 26, 2007

(51) Int. Cl.
*G11C 7/02* (2006.01)

(52) U.S. Cl. .................. 365/206; 365/172; 365/189.02

(58) Field of Classification Search ................ 365/206, 365/189.02, 203, 189.04, 189.09, 172
See application file for complete search history.

(56) References Cited

U.S. PATENT DOCUMENTS 6,522,590 B2 * 2/2003 Matsui et al. ............... 365/200
6,768,686 B2 7/2004 Frey
6,785,157 B2 * 8/2004 Arimoto et al. ............ 365/149
6,914,837 B2 7/2005 Schroeder et al.
6,992,343 B2 * 1/2006 Miyatake et al. ........... 257/296
2006/0098508 A1 * 5/2006 Choi et al. .................. 365/203

* cited by examiner

*Primary Examiner*—Anh Phung
*Assistant Examiner*—Dang Nguyen
(74) *Attorney, Agent, or Firm*—Edell, Shapiro & Finnan, LLC

(57) ABSTRACT

A semiconductor memory device is provided that uses a single wordline to access both storage cells of a so-called twin cell. A memory device comprises a plurality of wordlines and a plurality of bitlines in an array, with a plurality of storage cells at certain intersections of wordlines and bitlines. A plurality of sense amplifiers are provided, each of which is connected to at least a first pair of bitlines to detect a voltage difference on the bitlines caused by the charge from a twin storage cell comprised of first and second storage cells at the intersection of a single wordline with said first pair of bitlines, respectively. As a result, each cell of a twin storage cell can be accessed with a single wordline.

11 Claims, 4 Drawing Sheets

SENSE AMPLIFIER ORGANIZATION FOR TWIN CELL MEMORY DEVICES

BACKGROUND OF THE INVENTION

The present invention is directed to semiconductor devices, and more particularly to sense amplifier organization for semiconductor memory devices.

In semiconductor memory devices, such as a dynamic random access memory (DRAM) device, sense amplifiers are used to read data from a memory storage cell by evaluating the charge in the storage cell. FIG. 1 shows an exemplary prior art sense amplifier organization for a DRAM device. There are a plurality of wordlines (WLs) 10 and a plurality of bitlines (BLs) 20 that form a memory array 25. At the intersection of certain WLs 10 and certain BLs 20 there are storage cells 30. Sense amplifiers 40 are connected to the BLs 20 to detect a difference between the voltages on the two bitlines caused by the charge in the storage cells 30. FIG. 1 shows a folded bitline configuration, as an example.

In a one-transistor one-capacitor memory device, each WL 10 activates the access transistor (not shown) of a single storage cell. In a so-called "twin cell" organization, two storage cells 30 are used to store a charge that together represent a single bit, e.g., a "1,0"=logic "0" and "0,1"=logic "1". One way to realize the twin cell is to combine two standard storage cells. To do this in the memory structure shown in FIG. 1, it is necessary to activate two WLs in order to access each storage cell of the twin cell because the cells are on two different WLs, as shown by the exemplary twin cell pair at reference numeral 50.

It is desirable to reduce the number of wordlines that need to be activated and to reduce the silicon area required for sense amplifiers in a semiconductor memory device that uses the twin cell architecture.

SUMMARY OF THE INVENTION

A semiconductor memory device is provided that uses a single wordline to access both storage cells of a so-called twin cell. The memory device comprises a plurality of wordlines and a plurality of bitlines in an array, with a plurality of storage cells at certain intersections of wordlines and bitlines. A plurality of sense amplifiers are provided, each of which is connected to at least a first pair of bitlines. The sense amplifiers provide a means to detect the voltage difference on the bitlines caused by the charge from a twin storage cell comprised of first and second storage cells at the intersections of a single wordline with said first pair of bitlines, respectively. As a result, each cell of a twin storage cell can be accessed with a single wordline. Moreover, the bitlines may be separated from other active bitlines by at least one bitline. In operation, inactive bitlines are maintained connected to a precharge potential, thereby shielding the active bitlines from any other active bitlines in the same pair or not, such as in an adjacent pair served by a different sense amplifier.

DETAILED DESCRIPTION

Figure 1:
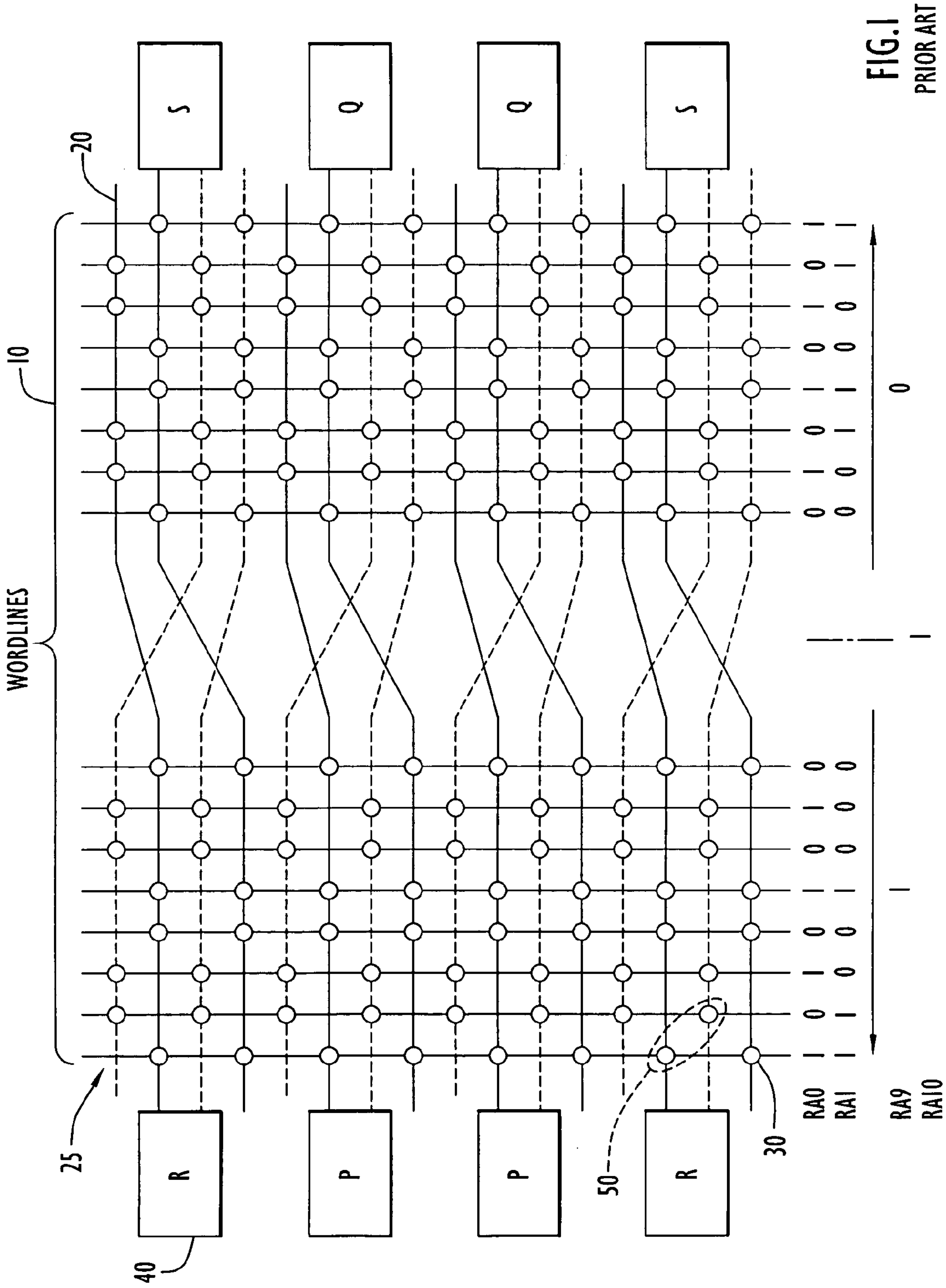
FIG. 1 is a block diagram showing a prior art sense amplifier organization.
Figure 2:
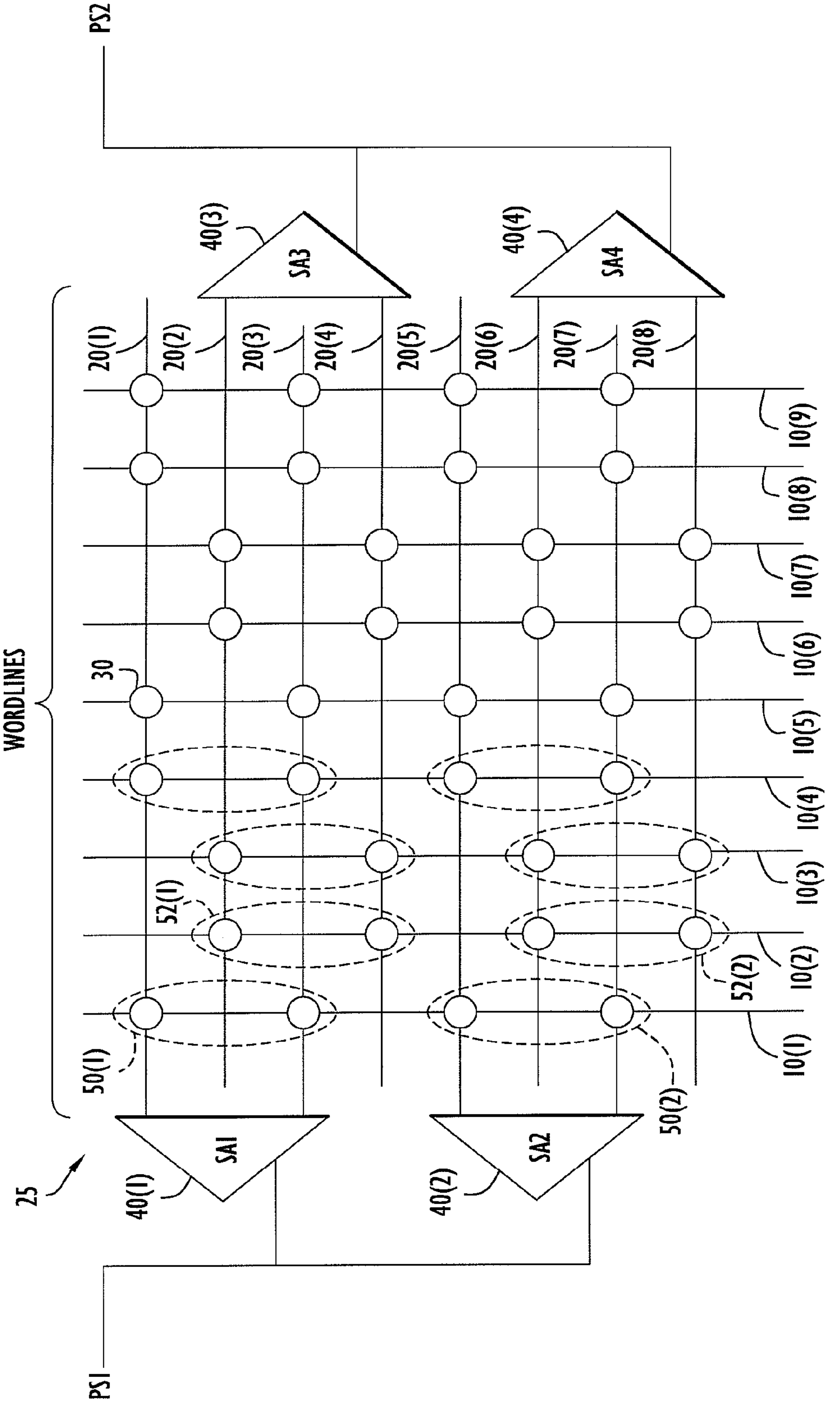
FIG. 2 is a block diagram according to a first embodiment of the invention.

With reference to FIG. 2, a first embodiment of the invention will be described. In the memory array 25, there are wordlines (WLs) 10(1)-10(9) that intersect with bitlines (BLs) 20(1)-20(8), and at certain of these intersections there are storage cells 30. One of the WLs, such as WL 10(9) may be a redundant WL used to access redundant storage cells in the event the storage cells on one of the other WLs in the array fails. There is a plurality of sense amplifiers (SAs), four of which are shown as an example, at reference numerals 40(1), 40(2), 40(3) and 40(4). The SAs are arranged in first and second columns that are on opposite sides of the array. By reorganizing the way that the BLs 20 connect to the SAs, an SA can detect the voltage difference on the bitlines caused by the charge in first and second storage cells that make up a twin storage cell using a single WL. Examples of twin cells are shown at reference numerals 50(1) and 50(2) on WL 10(1), and 52(1) and 52(2) on WL 10(2).

More specifically, the connections between BLs and SAs are made such that a unique pair of two non-adjacent (e.g., every other) BLs is connected to each SA. That is, the BLs in the pair are separated from each other by at least one other bitline. For example, the BL pair consisting of BLs 20(1) and 20(3) is connected to SA 40(1), the BL pair consisting of BLs 20(2) and 20(4) is connected to SA 40(3), the BL pair of BLs 20(5) and 20(7) is connected to SA 40(2), and the BL pair consisting of BLs 20(6) and 20(8) is connected to SA 40(4). Again, as shown in FIG. 2, with this connection arrangement, only a single WL needs to be activated to access each storage cell of a twin cell.

In addition, because every second BL stays precharged rather than adjacent BLs, the active BLs are better shielded from each other thereby reducing coupling effects between them. More specifically, for each SA, there is circuitry provided (though not shown for simplicity), sometimes known as an equalizer circuit in the art, that connects a precharge voltage to a BL served by the SA while that BL is inactive. Thus, between each active BL there is interspersed at least one other BL that is not floating, but rather is maintained connected to the precharge voltage or potential while they are inactive. Consequently, these inactive BLs serve as a shield between the active BLs that are being sensed to prevent coupling between the active BLs so that the active BLs do not work against each other during the charge sensing process.

Furthermore, this shielding from coupling extends to any other active BL in the same BL pair or not, e.g., between adjacent BL pairs. That is, bitlines which may be active concurrently are separated by at least one inactive bitline which is at the same time connected to a precharge potential. For example, the BL pair consisting of BLs 20(1) and 20(3) served by SA 40(1) are separated by BL 20(4) from the BL pair consisting of BLs 20(5) and 20(7) served by SA 40(2), and SA40(1) and SA40(2) are not active concurrently. A similar relationship exists in the other SA column for the BL pair consisting of BLs 20(2) and 20(4) served by SA 40(3) and the BL pair consisting of BLs 20(6) and 20(8) served by SA40 (4).

In the SA configuration of FIG. 2, all of the SAs in one of the columns in the array 25 are activated when a particular WL is activated. A first power supply signal PS1 is connected by a wire in common to each SA in the left column and a second power supply signal PS2 is connected by a wire in common to each SA in the right column. The SAs in the left column are connected to half of the BLs in the array and the SAs in the right column are connected to the remaining half of the BLs in the array. For example, when WL 10(1), 10(4), 10(5), 10(8) or 10(9) is activated, a first power supply signal PS1 goes active to activate the entire left hand column of SAs, and when WL 10(2), 10(3), 10(6) or 10(7) is activated, a second power supply signal PS2 goes active to activate the entire right hand column of SAs.

Figure 3:
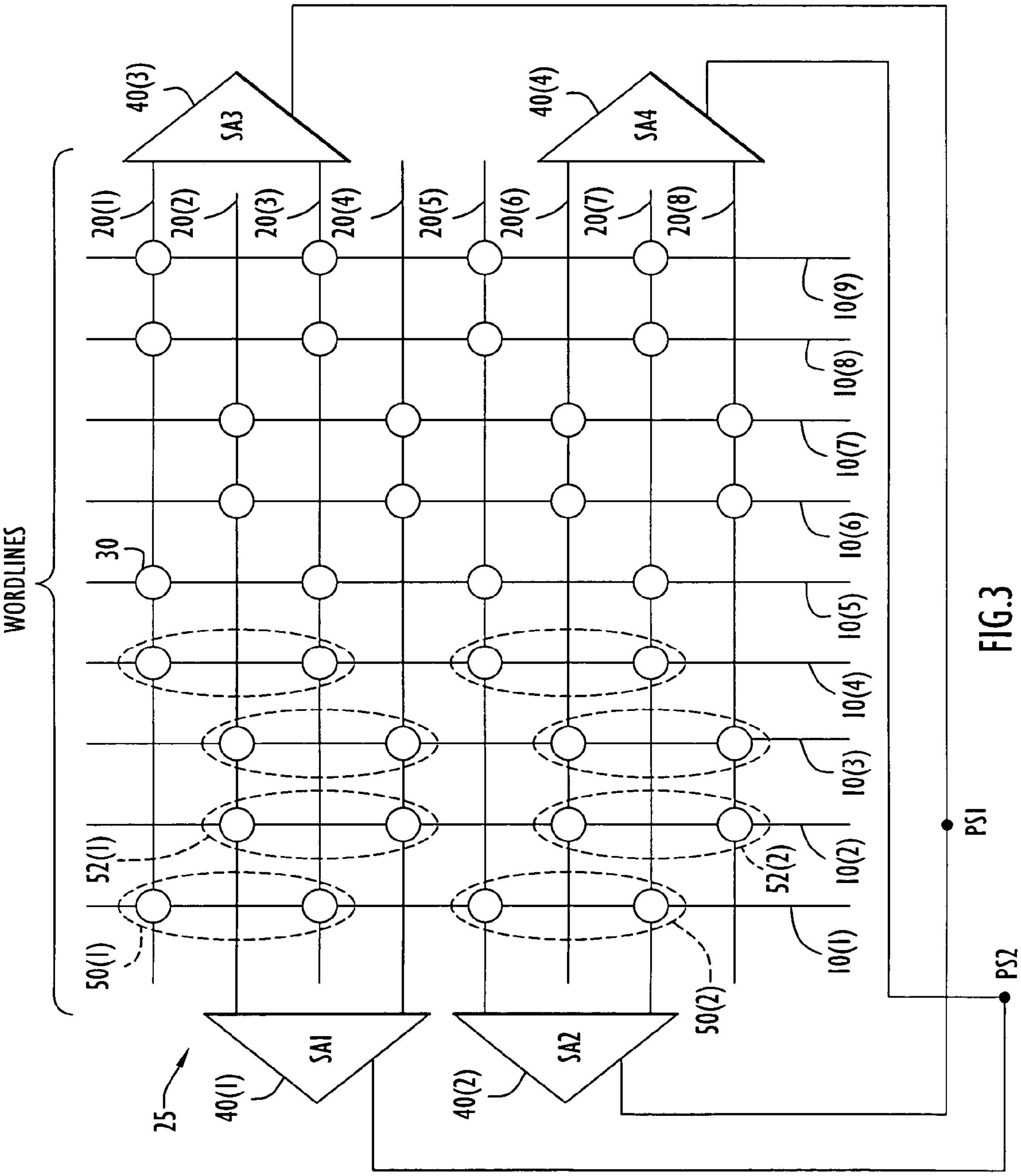
FIG. 3 is a block diagram according to a second embodiment of the invention.

Turning to FIG. 3, a sense amplifier organization is shown according to a second embodiment. In this arrangement, the SAs are each connected to a pair of BLs (alternating BLs, similar to the embodiment of FIG. 2), but are connected to the BLs so that when a given WL is activated, an entire column of SAs is not activated. The SAs in the left column are connected to half of the BLs in the array and the SAs in the right column are connected to the remaining half of the BLs in the array. However, for any activated WL, half of the SAs in the left hand column are activated and half of the SAs in the right hand column are activated. For example, when WL 10(1), 10(4), 10(5), 10(8) or 10(9) is activated, SA 40(3) in right column of SAs is activated and SA 40(2) is activated in the left column of SAs. Similarly, when WL 10(2), 10(3), 10(6) or 10(7) is activated, SA 40(1) is activated in the left column of SAs and SA 40(4) is activated in the right column of SAs. The configuration shown in FIG. 3 also has the shielding benefits afforded by interspersing inactive BLs connected to a precharge voltage between active BLs, as described above in conjunction with FIG. 2.

The configuration shown in FIG. 3 has the advantage that the power supply wire to the SA columns is split since only half of a column of SAs is activated for any activated WL. This is shown in FIG. 3 where the first power supply signal PS1 is routed by a wire in common to half of the SAs in each column, e.g., SA 40(2) and SA 40(3) and the second power supply signal PS2 is routed by a wire to the remaining half of the SAs in each column, e.g., SA 40(1) and 40(4). This makes routing the power supply wires to the SAs easier and also reduces voltage drop in the wires.

Figure 4:
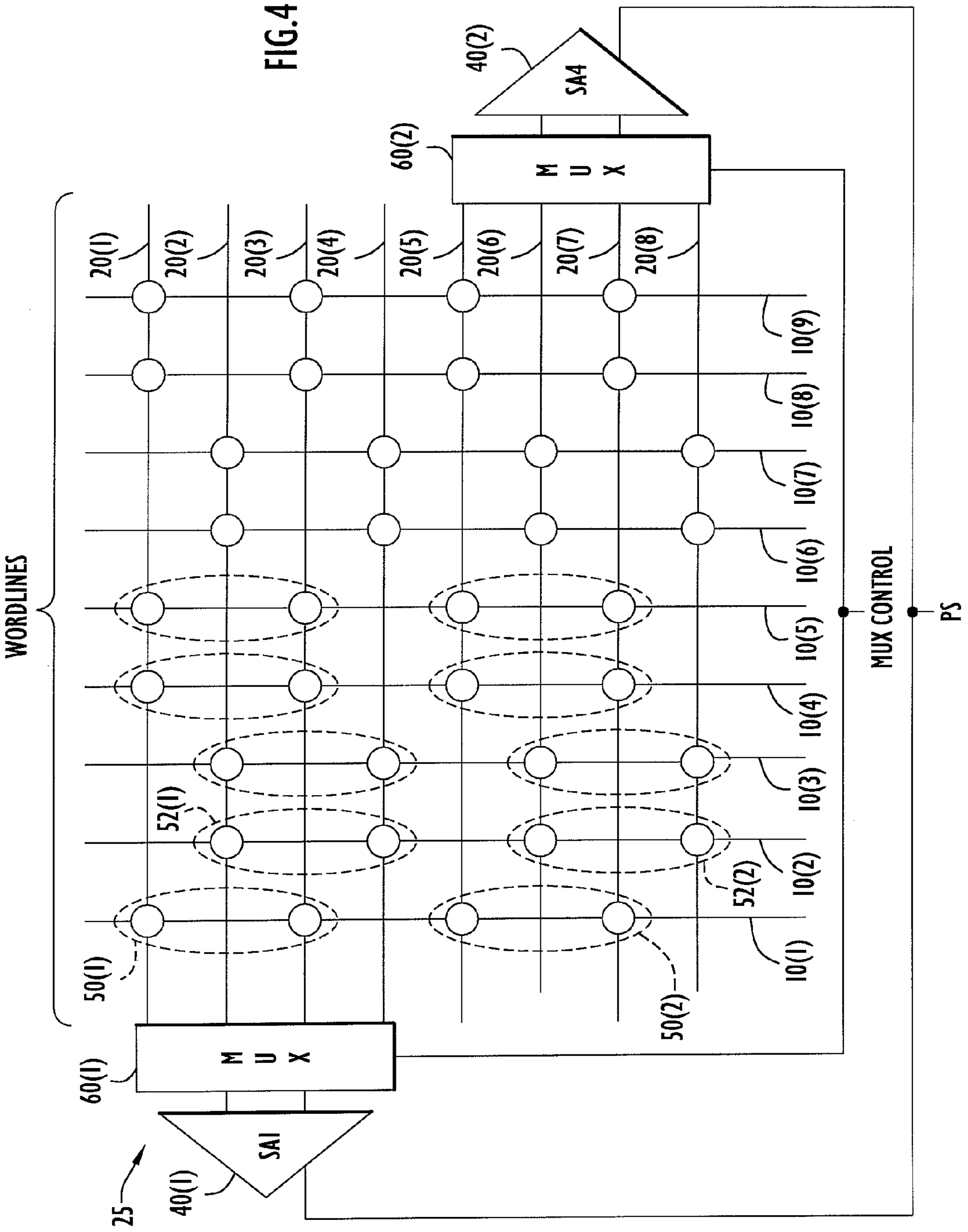
FIG. 4 is a block diagram according to a third embodiment of the invention.

FIG. 4 shows still another configuration where the number of SAs in a column can be reduced by one-half. Since only half of the BLs are being used at any one time, the SAs can be multiplexed to pairs of BLs so that only half as many SAs are required, which leads to significant reduction in the size of a memory chip.

Specifically, in the example shown in FIG. 4, there is a multiplexer (MUX) 60(1) associated with SA 40(1) and a MUX 60(2) associated with SA 40(2). MUX 60(1) is connected to BLs 20(1)-20(4), and depending on which of the WLs is activated, is controlled to select either BL pair 20(1)/20(3) or the BL pair 20(2)/20(4) for connection to the SA 40(1). Similarly, MUX 60(2) is connected to BLs 20(5)-20(8), and depending on which of the WLs is activated, is controlled to select either BL pair 20(5)/20(7) or BL pair 20(6)/20(8) for connection to the SA 40(2). A MUX control signal is connected to each MUX 60(1) and 60(2) to control which BL pair it connects to its associated SA. When WL 10(1), 10(4), 10(5), 10(8) or 10(9) is activated, MUX 60(1) is controlled to select BL pair 20(1)/20(3) for connection to SA 40(1) and MUX 60(2) is controlled to select BL pair 20(5)/20(7) for connection to SA 40(2). When WL 10(2), 10(3), 10(6) or 10(7) is activated, MUX 60(1) is controlled to select BL pair 20(2)/20(4) for connection to SA 40(1) and MUX 60(2) is controlled to select BL pair 20(6)/20(8) to SA 40(2). The shielding benefits described above are also provided by the configuration shown in FIG. 4. In the case of the embodiment of FIG. 4, the equalization circuit that supplies the precharge voltage or potential to the inactive BLs would be included in the MUX's 60(1) and 60(2) or otherwise configured such that they are always connected to the inactive BLs regardless of which BL pair is connected to the associated SA.

The foregoing description is made with respect to an array of eight WLs (plus one redundant WL) and eight BLs only for simplicity and only as an example. It should be understood that the concepts described herein are applicable to a memory array of any size (larger or smaller) with or without column (bitline) or row (wordline) redundancy. Moreover, while the foregoing discloses that the bitline pair which is connected to the sense amplifier is separated by one other bitline, it is possible that the bitline pair may be separated by more than one other bitline if the storage cell array configuration is adapted to suit such an arrangement. Thus, in general, each sense amplifier is connected to a unique pair of bitlines that are separated by at least one other bitline.

The system and methods described herein may be embodied in other specific forms without departing from the spirit or essential characteristics thereof. The foregoing embodiments are therefore to be considered in all respects illustrative and not meant to be limiting.

What is claimed is:

1. A semiconductor memory device comprising:

a. a plurality of wordlines and a plurality of bitlines arranged in an array;

b. a plurality of storage cells at certain intersections of wordlines and bitlines;

c. a plurality of sense amplifiers, wherein each sense amplifier is connected to either a first pair of bitlines or to a second pair of bitlines depending on which of the plurality of wordlines is activated, in order to detect a voltage difference on the bitlines caused by the charge from a twin storage cell comprised of first and second storage cells at the intersections of a single one of the plurality of wordlines with said first pair of bitlines or with said second pair of bitlines, respectively; and d. a multiplexer connected to each sense amplifier, to said first pair of bitlines and to said second pair of bitlines, wherein the multiplexer selects either said first pair of bitlines or said second pair of bitlines for connection to the associated sense amplifier.

2. The memory device of claim 1, wherein the plurality of sense amplifiers are arranged in first and second columns that are on opposite sides of the array, wherein the first column of sense amplifiers connects to half of the bitlines in the array and the second column of sense amplifiers connects to the remaining half of the bitlines, wherein when a wordline is activated the sense amplifiers in exclusively either the first column or the second column of are activated.

3. The memory device of claim 1, wherein the plurality of sense amplifiers are arranged in first and second columns that are on opposite sides of the array, wherein the first column of sense amplifiers connects to half of the bitlines in the array and the second column of sense amplifiers connects to the remaining half of the bitlines, wherein when a wordline is activated half of the sense amplifiers in the first column are activated and half of the sense amplifiers in the second column are activated.

4. A semiconductor memory device comprising:

a. a plurality of wordlines and a plurality of bitlines arranged in an array;

b. a plurality of storage cells at certain intersections of wordlines and bitlines;

c. a plurality of sense amplifiers, wherein each sense amplifier is connected to either a first unique pair of bitlines or to a second unique pair of bitlines depending on which of the plurality of wordlines is activated, wherein the bitlines within each of the first and second unique pairs are separated from each other by at least one other bitline, wherein each sense amplifier detects a voltage difference on the bitlines caused by the charge from a twin storage cell comprised of storage cells at the intersections of either the first unique pair of bitlines or of the second unique pair of bitlines and one of the plurality of wordlines, wherein said at least one other bitline is maintained connected to a precharge potential thereby shielding the bitlines in the first unique pair or in the second unique pair from coupling with each other; and d. a multiplexer connected to each sense amplifier, to said first unique pair of bitlines and to said second unique pair of bitlines, wherein the multiplexer selects either said first unique pair of bitlines or said second unique pair of bitlines for connection to the associated sense amplifier.

5. The memory device of claim 4, wherein the plurality of sense amplifiers are arranged in first and second columns that are on opposite sides of the array, wherein the first column of sense amplifiers connects to half of the bitlines in the array and the second column of sense amplifiers connects to the remaining half of the bitlines, wherein when a wordline is activated half of the sense amplifiers in the first column are activated and half of the sense amplifiers in the second column are activated.

6. The memory device of claim 4, and farther comprising a first set of power supply lines connected to a first half of the sense amplifiers in the first column and to a first half of the sense amplifiers in the second column, and a second set of power supply lines connected to a second half of the sense amplifiers in the first column and to a second half of the sense amplifiers in the second column.

7. The memory device of claim 4, wherein bitlines which may be active concurrently are separated by at least one inactive bitline which is at the same time connected to a precharge potential.

8. A semiconductor memory device comprising:

a. a plurality of wordlines and a plurality of bitlines arranged in an array;

b. a plurality of storing means for storing charge, each of said storing means being at certain intersections of wordlines and bitlines;

c. a plurality voltage difference sensing means for sensing a voltage difference created on the bitlines from said storing means, wherein each voltage difference sensing means is connected to either a first unique pair of bitlines or to a second unique pair of bitlines depending on which of the plurality of wordlines is activated, in order to detect a voltage difference on the bitlines caused by the charge from a twin storage cell comprised of first and second storing means at the intersections of a single wordline with said first unique pair of bitlines or with said second unique pair of bitlines, respectively; and d. multiplexing means connected to each voltage difference sensing means, to said first unique pair of bitlines and to said second unique pair of bitlines, the multiplexing means for selecting either said first unique pair of bitlines or said second unique pair of bitlines for connection to the voltage difference sensing means.

9. A semiconductor memory device comprising:

a. a plurality of wordlines and a plurality of bitlines arranged in an array;

b. a plurality of storing means for storing charge, each of said storing means being at certain intersections of wordlines and bitlines; and c. a plurality voltage difference sensing means for sensing a voltage difference created on the bitlines from said storing means, wherein each voltage difference sensing means is connected to either a first unique pair of bitlines or to a second unique pair of bitlines depending on which of the plurality of wordlines is activated, wherein the bitlines within the first unique pair and within the second unique pair are separated from each other by at least one other bitline and wherein each voltage difference sensing means detects a voltage difference on the bitlines in said first unique pair or in said second unique pair caused by the charge from a twin storage cell comprised of first and second storing means at the intersections of a single wordline with either said first unique pair of bitlines or said second unique pair of bitlines, respectively, wherein said at least one other bitline is maintained connected to a precharge potential thereby shielding the bitlines in the first unique pair or in the second unique pair from coupling with each other; and d. multiplexing means connected to each voltage difference sensing means, to said first unique pair of bitlines and to said second unique pair of bitlines, the multiplexing means for selecting either said first unique pair of bitlines or said second unique pair of bitlines for connection to the voltage difference sensing means.

10. The device of claim 9, wherein bitlines which may be active concurrently are separated by at least one inactive bitline which is at the same time connected to a precharge potential.

11. A method for sensing charge from storage cells of a semiconductor memory device that comprises a plurality bitlines and a plurality of wordlines in an array with storage cells at certain intersections of the bitlines and wordlines, the method comprising:

a. activating a particular wordline;

b. selecting for connection to each of a plurality of sense amplifiers a particular pair of bitlines out of multiple pairs of bitlines associated with a corresponding sense amplifier, wherein said selecting depends on which particular wordline of the plurality of wordlines is activated, wherein selecting comprises controlling a multiplexer to connect said particular pair of bitlines to said corresponding sense amplifier depending on the particular wordline that is activated; and c. sensing a voltage difference caused by the charge from twin storage cells comprised of a pair of storage cells on said particular wordline at the intersection with said particular pair of bitlines.

* * * * *

UNITED STATES PATENT AND TRADEMARK OFFICE

CERTIFICATE OF CORRECTION

PATENT NO. : 7,324,396 B2
APPLICATION NO. : 11/253727
DATED : January 29, 2008
INVENTOR(S) : Peter Thwaite It is certified that error appears in the above-identified patent and that said Letters Patent is hereby corrected as shown below:

Column 5, Line 32: Change “farther” to -- further --

Signed and Sealed this

Thirteenth Day of May, 2008

JON W. DUDAS
*Director of the United States Patent and Trademark Office*